United States Patent [19]

Wong

[11] Patent Number: 4,891,112

[45] Date of Patent: Jan. 2, 1990

[54] SPUTTERING METHOD FOR REDUCING HILLOCKING IN ALUMINUM LAYERS FORMED ON SUBSTRATES

[75] Inventor: Kwok Y. Wong, Penfield, N.Y.

[73] Assignee: Eastman Kodak Company, Rochester, N.Y.

[21] Appl. No.: 797,095

[22] Filed: Nov. 12, 1985

[51] Int. Cl.$^4$ .............................. C23C 14/34
[52] U.S. Cl. ................. 204/192.3; 204/192.15; 204/192.35
[58] Field of Search ........ 204/192 R, 192 C, 192 EC, 204/298, 192.12, 192.15, 192.3, 192.32, 192.35, 298 E

[56] References Cited

U.S. PATENT DOCUMENTS

| | | | |
|---|---|---|---|
| 3,451,912 | 6/1969 | D'heurle et al. | 204/192 EC |
| 3,761,372 | 9/1973 | Sastri | 204/192 EC |
| 4,007,103 | 2/1977 | Baker et al. | 204/192 EC |
| 4,012,756 | 3/1977 | Chaudhari et al. | 357/5 |
| 4,111,775 | 9/1978 | Hollis, Jr. et al. | 204/192 |
| 4,124,472 | 11/1978 | Riegert | 204/192 EC |
| 4,184,933 | 1/1980 | Morcom et al. | 204/192 |
| 4,324,803 | 4/1982 | Bergmann et al. | 204/192 EC |
| 4,336,118 | 6/1982 | Patten et al. | 204/192 EC |
| 4,468,438 | 8/1984 | Patten et al. | 204/192 R |
| 4,525,733 | 6/1985 | Losee | 357/65 |

*Primary Examiner*—Nam X. Nguyen
*Attorney, Agent, or Firm*—Raymond L. Owens

[57] ABSTRACT

Hillock formation in a layer of aluminum sputtered from a target onto a substrate is reduced by applying a potential to the substrate sufficient to cause some re-sputtering of some aluminum from the deposited layer while at the same time sputtered aluminum from a target is being deposited onto the surface of the substrate. Aluminum grain size in the deposited layer is reduced to the extent that stress is relieved.

5 Claims, 1 Drawing Sheet

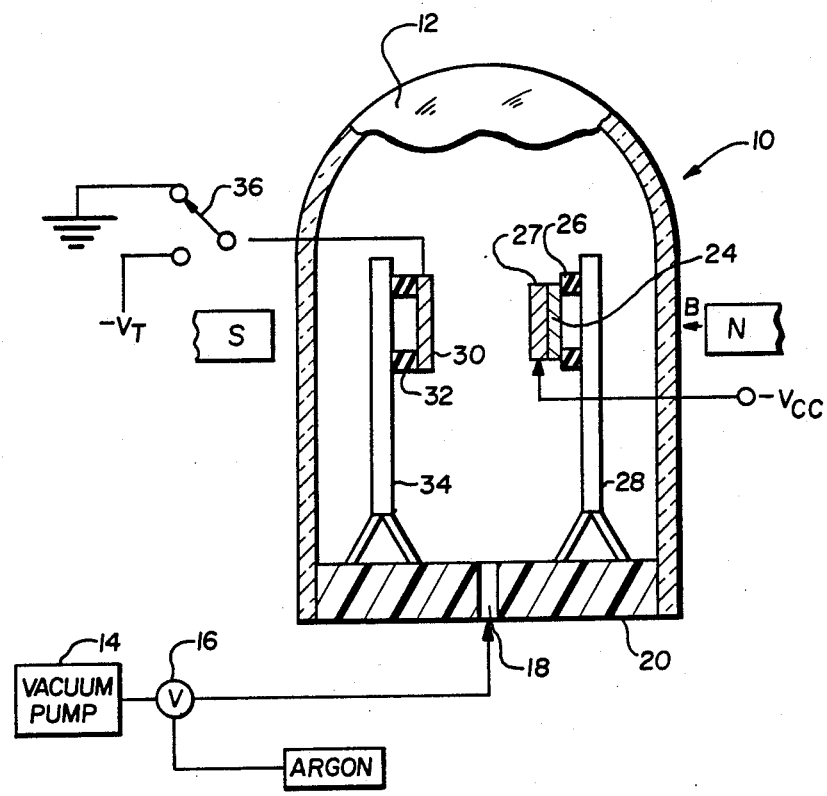

SPUTTERING METHOD FOR REDUCING HILLOCKING IN ALUMINUM LAYERS FORMED ON SUBSTRATES

FIELD OF THE INVENTION

This invention relates to a method for reducing the formation of hillocks in aluminum layers sputtered onto substrates.

BACKGROUND OF THE INVENTION

In a well-known process, a thin aluminum layer is deposited by sputtering onto a substrate. Atoms of aluminum from a target are ejected from the target by impact from an ionized gas. The aluminum atoms are then deposited on the surface of the substrate.

When a thin metal layer, particularly a soft metal such as aluminum with a high coefficient of thermal expansion is sputtered onto a substrate with a low coefficient of thermal expansion, such as silicon or silicon dioxide, microscopic protrusions often appear in the surface of the metal layer. Such protrusions commonly appear in the aluminum metallization layers deposited on oxidized silicon surfaces in the manufacture of integrated circuits. Protrusions appearing immediately after deposition of the aluminum layer are termed "growth hillocks". The protrusions which develop after cycling the integrated circuit to a high temperature during manufacturing steps are called "annealing hillocks".

In either case, these microscopic protrusions or hillocks are troublesome and can cause subsequent device failure. For example, hillocks can cause shorts between conductive layers in a device in areas where conductors cross over one another, or in elements of the device having two layers of conductors such as integrated capacitors. More particularly, if an insulating layer, e.g. $SiO_2$ is formed on an aluminum layer at a thickness of less than $1\mu$, metal hillocks greater than $1\mu$ will protrude through the $SiO_2$ layer and contact any subsequently deposited metal layers, causing a short circuit. The protrusion of the hillocks potentially causes short circuits between conductive layers in a device at positions where the conductors cross over each other, or in devices where there are two spaced apart layers such as in capacitors, forming part of an integrated circuit. Hillocks are also found in aluminum layers formed in optical discs.

Previous attempts to overcome the problem of hillock formation in thin aluminum layers have included the addition of impurities such as silicon, copper, silver and gold to the aluminum to immobilize the grain boundaries in the metal layer (see e.g. U.S. Pat. No. 4,012,756 issued Mar. 15, 1977 to Chaudhari et al). One suggested approach to reducing hillocks specifically in aluminum layers is to treat the layer to form a boehmite (AlO-OH) layer on its surface; see e.g. U.S. Pat. No. 3,986,897 issued Oct. 19, 1976 to McMillan et al.

Yet another disclosed approach to reducing hillocks in aluminum layers is to alternate layers of aluminum and an aluminum oxygen alloy, by periodically introducing controlled bursts of oxygen into an aluminum deposition chamber. None of these approaches has proved entirely satisfactory however.

The object of this invention is to provide a simple, effective means of reducing hillock formation in aluminum layers sputtered onto a substrate.

SUMMARY OF THE INVENTION

This object is achieved in a method in which aluminum is sputtered from a target onto the surface of a substrate to deposit a layer of aluminum metal. During such deposition, aluminum is resputtered from the layer being deposited which reduces aluminum grain size in the deposited layer sufficient to relieve stress causing the reduction of hillock formation.

The resputtering step can be caused by applying a negative DC potential to the substrate. It is preferably applied after a portion of the layer has been deposited which is sufficient to cover the substrate surface. Aluminum is deposited on the substrate at a rate greater than it is removed by resputtering.

Devices made in accordance with this method have a reduced tendency to short circuit.

A feature of this invention is that in certain instances, post-treatments given to aluminum layers may be eliminated.

DESCRIPTION OF THE DRAWING

The single drawing is a schematic, partially in cross section, of a representative sputtering device for depositing an aluminum layer onto a substrate.

DESCRIPTION OF THE PREFERRED EMBODIMENT

As used herein, the term "substrate" means the underlying material such as for example silicon, silicon dioxide or silicon nitride on which an aluminum layer is deposited. The term "substrate" does not, however, mean only the base material forming the wafer on which a device such as an integrated circuit is fabricated. The substrate on which the aluminum layer is applied may also include appropriate dopants to provide n or p type dopings depending upon the device being fabricated. It is preferable that the deposited aluminum layer has a significantly higher coefficient of thermal expansion than the selected substrate.

Ordinarily aluminum targets are doped with 1% silicon and sometimes from 1 to 4% copper. These impurities help to prevent cracks from forming at the interface between the deposited aluminum layer and the substrate.

Referring to the drawing, there is shown in schematic form a conventional device 10 in which sputtering takes place. The device 10 includes a hollow bell jar 12. The bell jar 12 is evacuated by means of a vacuum pump 14 acting through a valve 16 and a passage 18 in the base 20 of the bell jar 12. Inside of the bell jar 12 there is an aluminum target 27 mounted on a metal plate 24. Plate 24 is mounted on insulating supports 26 of a frame structure 28.

A substrate 30 is mounted on insulating supports 32 which in turn is secured to a frame 34. A DC voltage source $-V_{cc}$ is connected to the target 27. A magnetic field B may also be applied in a direction to extend through the space in which the substrate is mounted as shown schematically by the magnet pole pieces labeled N and S. As is well known, the purpose of the magnetic field is to concentrate the electrons adjacent to the target. This causes an increase in the deposition of aluminum on the substrate. The interior of jar 12 is at a very low pressure. A switch 36 is movable between two positions. In the first position the substrate 30 is connected to ground. In the second position a bias D.C. voltage $(-V_T)$ is applied to the substrate. This D.C.

voltage $-V_T$ is selected to be at a level which will substantially reduce hillocks as will shortly be described.

In operation, the switch 36 is in its first position and the argon gas introduced into the evacuated bell jar 12 through valve 16. The argon gas is subject to the electric field applied between the target 27 and the grounded substrate 30. Ionization of the argon gas is self-initiating and no additional electric source is needed. Stray electrons are generated from the surface of the aluminum target 27 and collides with and ionize argon gas molecules producing positive Ar+ ions. Each positive argon ion stemming from this ionization process is accelerated by the electric field back towards the target 27. Bombardment of the target 27 with positive argon ions causes sputtering of aluminum atoms which are thereby projected towards the substrate 30. This sputtering establishes the primary deposition rate of the aluminum layer on the substrate. As we will see, some aluminum will be resputtered from the deposited layer when the potential $-V_T$ is applied. This rate is less than the primary deposition rate.

The primary rate of coating of the substrate 30 and the thickness of the coating can be controlled by: adjusting the temperature inside the bell jar 12, varying the spacing between the target 27 and the substrate 30, varying the pressure of the argon gas, varying the magnetic field strength and varying the level of the voltage $-V_{cc}$.

Initially, the switch 36 is in its first position and the substrate is grounded. After a layer of aluminum is deposited which is sufficient to coat the surface of the substrate 30, the switch 36 is moved to its second position and the potential $-V_T$ is applied to the substrate 30. This causes resputtering.

It has been found that if an appropriate negative potential is applied to the target, the growth of hillocks in the aluminum layer can be substantially eliminated. The following is an explanation of the mechanism for reducing hillock formation.

After a thin layer of aluminum which is sufficient to provide a conductive coating over the entire substrate surface has been deposited, the bias potential $-V_T$ is applied to the substrate 30. The purpose of coating the wafer before the voltage $-V_T$ is applied is to insure that all positions of the surface of this coating will be at the same potential. This uniform bias potential causes some resputtering of aluminum away from the substrate. This resputtering is at a relatively uniform rate at all positions on surface of the deposited layer on the substrate. Resputtering causes a rearrangement of the aluminum structure reducing grain size which acts to relieve stress. The removal of aluminum by resputtering is at a rate lower than the primary deposition rate. The resputtering rate must be sufficient to cause a reduction of aluminum grain size. The reduction of grain size relieves stress and reduces hillock formation.

The invention is further illustrated by the following examples. In each of these examples sputtering was done in a Varian 3180 Coater using a DC magnetron cathode establishing a magnetic field and several samples were coated on a silicon substrate. Aluminum targets with 1% silicon were used.

EXAMPLE 1

(D.C. Bias applied after substrate coated with aluminum)

Several coatings were made. The pressure in the device was at $1.8 \times 10^{-7}$ torr. Argon gas was introduced raising the pressure to $6.0 \times 10^{-3}$ torr. $V_{cc}$ in several coatings was set between $-500$ and $-600$ volts DC. The rate of deposition of material on the substrate was approximately 10,000 A/min. During the coatings, the temperature inside the device was in a range of about 0°-300° C. A number of coatings were made where the total sputter time was approximately 37 seconds of which the first 5 seconds no DC bias ($-V_T$) was applied. When a negative potential $-V_T$ of between $-100$ V to $-300$ V was applied, hillock formations were substantially curtailed.

EXAMPLE 2

(No Bias applied)

Coatings using the same conditions as in Example 1 were made except ($-V_T$) was 0 volts. In other words no bias.

In Example 2, the grain size of aluminum layer deposited without bias was about 7 microns, while in Example 1 the maximum grain size was about 3 microns. Grain size was measured using transmission electron microscopy. Hillock size in Example 1 was measured at about 1,000 A (0.1μ). In Example 2 hillocks were measured at about 1-2μ. Hillock size was measured using scanning electron microscopy. The smaller grain size in Example 1 relieved stress in the deposited layer. Relieving this stress caused a reduction in hillock formation.

The invention has been described in detail with particular reference to a preferred embodiment thereof, but it will be understood that variations and modifications can be effected within the spirit and scope of the invention.

I claim:

1. A method of reducing hillocks occurring in the layer of metal sputtered onto a substrate comprising the steps of:
   (a) sputtering metal from a target onto the surface of a substrate to deposit a metal layer on such substrate surface; and
   (b) during such deposition, resputtering metal from the deposited layer to reduce metal grain size in the layer being deposited to an extent that relieves stress causing the reduction of hillock formation in the deposited layer.

2. A method of reducing hillocks occuring in the layer of aluminum sputtered onto a substrate comprising the steps of:
   (a) sputtering aluminum from a target onto the surface of a substrate to deposit a layer of aluminum on such substrate surface; and
   (b) during such deposition, resputtering aluminum from the deposited layer to reduce aluminum grain size in the layer being deposited to an extent that relieves stress causing the reduction of hillock formation in the deposited layer.

3. A method of reducing hillocks occurring in the layer of aluminum sputtered onto a substrate comprising the steps of:
   (a) sputtering aluminum from a target onto the surface of a substrate to deposit a layer of aluminum on such substrate surface; and (b) during such deposition, applying to the substrate a negative potential which is selected to cause a resputtering of some aluminum from the layer which reduces aluminum grain size in the layer being deposited to an extent that relieves stress and causes the reduction of hillock formation in the deposited layer.

4. A method of reducing hillocks in a layer of aluminum sputtered onto a substrate comprising the steps of:
   (a) sputtering aluminum from a target onto the surface of a substrate to deposit a layer of aluminum on such substrate surface; and
   (b) after a portion of the aluminum layer has been formed by step (a) which is sufficient to cover the substrate surface, applying a negative DC potential to the substrate selected to cause resputtering of some aluminum from the layer which reduces aluminum grain size in the layer being deposited to the extent that relieves stress and causing the reduction of hillock formation in the deposited layer.

5. The method of claim 4 wherein said substrate is selected from the group consisting of silicon, silicon dioxide and silicon nitride.

* * * * *